US010283611B2

(12) United States Patent
Cho et al.

(10) Patent No.: US 10,283,611 B2
(45) Date of Patent: May 7, 2019

(54) ELECTRONIC DEVICE INCLUDING TOPOLOGICAL INSULATOR AND TRANSITION METAL OXIDE

(71) Applicant: Industry-Academic Cooperation Foundation, Yonsei University, Seoul (KR)

(72) Inventors: MannHo Cho, Seoul (KR); KwangSik Jeong, Seoul (KR); DaeHong Ko, Goyang-si (KR); DongHyeok Lim, Paju-si (KR); TaeHyeon Kim, Hwaseong-si (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/658,736

(22) Filed: Jul. 25, 2017

(65) Prior Publication Data

US 2018/0090592 A1   Mar. 29, 2018

(30) Foreign Application Priority Data

Sep. 27, 2016 (KR) .................. 10-2016-0123915
Oct. 7, 2016 (KR) .................. 10-2016-0129662
Apr. 3, 2017 (KR) .................. 10-2017-0043179

(51) Int. Cl.
*H01L 29/417* (2006.01)
*H01L 29/51* (2006.01)
*H01L 29/423* (2006.01)

(52) U.S. Cl.
CPC ...... *H01L 29/517* (2013.01); *H01L 29/41758* (2013.01); *H01L 29/42364* (2013.01); *H01L 29/511* (2013.01)

(58) Field of Classification Search
CPC ............ H01L 29/517; H01L 29/41758; H01L 29/42364; H01L 29/511
See application file for complete search history.

(56) References Cited

U.S. PATENT DOCUMENTS 7,825,486 B2   11/2010   Karg et al.
8,502,343 B1   8/2013   Jha et al.
(Continued)

FOREIGN PATENT DOCUMENTS

KR   10-0913395 B1   8/2009
KR   10-0918465      9/2009
(Continued)

OTHER PUBLICATIONS

Yoon Cheol Bae et al., "Oxygen Ion Drift-Induced Complementary Resistive Switching in Homo TiOx/TiOy/TiOx and Hetero TiOx/TiON/TiOx Triple Multilayer Frameworks", Adv. Funct. Mater. 2012, 22, 709-716.
(Continued)

*Primary Examiner* — Moin M Rahman
(74) *Attorney, Agent, or Firm* — Harness, Dickey & Pierce, P.L.C.

(57) ABSTRACT

An electronic device may include a topological insulating layer including first and second surfaces facing each other and a transition metal oxide layer provided on the first surface of the topological insulating layer. The topological insulating layer may have a thickness ranging from 1 nm to 10 nm.

17 Claims, 16 Drawing Sheets

(56) References Cited

U.S. PATENT DOCUMENTS

| | | | | |
|---|---|---|---|---|
| 2012/0273763 | A1* | 11/2012 | Banerjee | H01L 49/003 257/39 |
| 2013/0214854 | A1* | 8/2013 | Abe | H01L 27/0705 327/541 |
| 2014/0339488 | A1* | 11/2014 | Kang | H01L 45/146 257/2 |
| 2015/0333163 | A1* | 11/2015 | Qiliang | H01L 29/78696 257/24 |
| 2016/0111643 | A1 | 4/2016 | Yeom et al. | |
| 2016/0169986 | A1 | 6/2016 | Li et al. | |
| 2018/0175285 | A1* | 6/2018 | Yoshimi | H01L 27/105 |

FOREIGN PATENT DOCUMENTS

| | | |
|---|---|---|
| KR | 10-2010-0106154 A | 9/2010 |
| KR | 10-2012-0079310 A | 7/2012 |
| KR | 10-2013-0126949 A | 11/2013 |
| KR | 10-2016-0046159 A | 4/2016 |
| WO | WO-2012/078774 A1 | 6/2012 |

OTHER PUBLICATIONS

Byung Cheol Park et al., "Terahertz single conductance quantum and topological phase transitions in topological insulator Bi2Se3 ultrathin films", Nature Communications 6, Article No. 6552, Published online: Mar. 16, 2015.

Yi Zhang et al., "Crossover of the three-dimensional topological insulator Bi2Se3 to the two-dimensional limit", Nature Physics. vol. 6. Aug. 2010, Published online: Jun. 13, 2010.

A. Yazdani, Topological Surface States: Science and Potential Applications, Department of Physics, Princeton University, Princeton, NJ USA 08544, 2012.

L.B. Abdalla et al., "Topological insulator Bi2Se3(111) surface doped with transition metals: An ab initio investigation", Physical Review B 88, 045312, 2013.

Andrei Malashevich et al., "First-principles DFT+GW study of oxygen vacancies in rutile TiO2", Department of Physics, University of California, 2014.

Yong Yang et al., "Possible Magnetic Behavior in Oxygen-deficient β-PtO2", (Phys. Rev. B85, 035204), published on Feb. 15, 2012.

\* cited by examiner

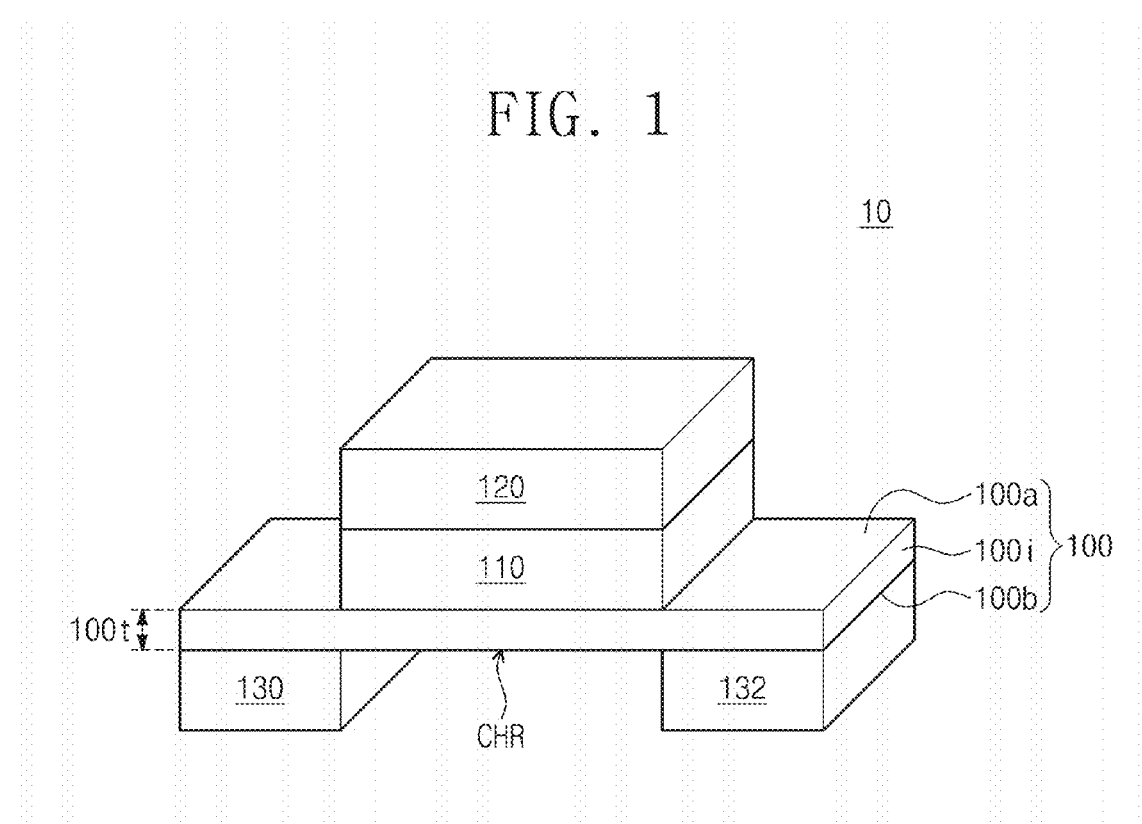

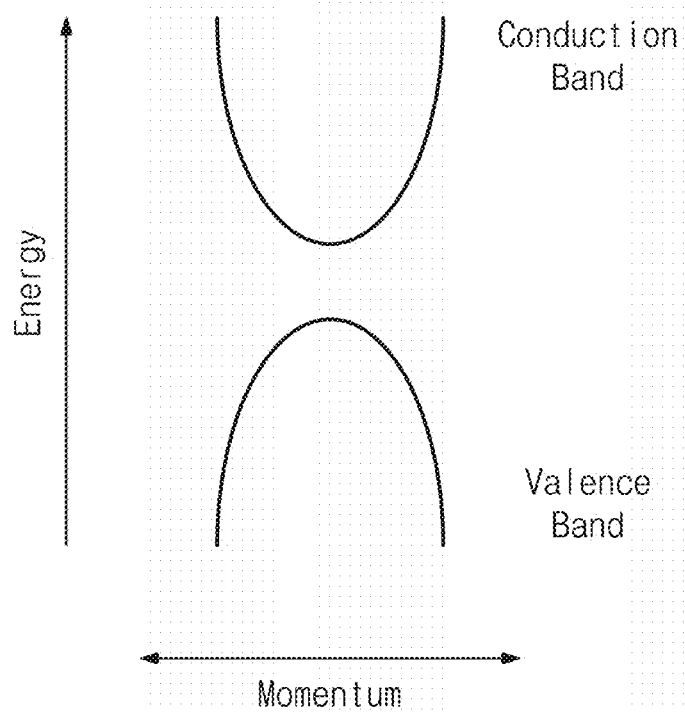

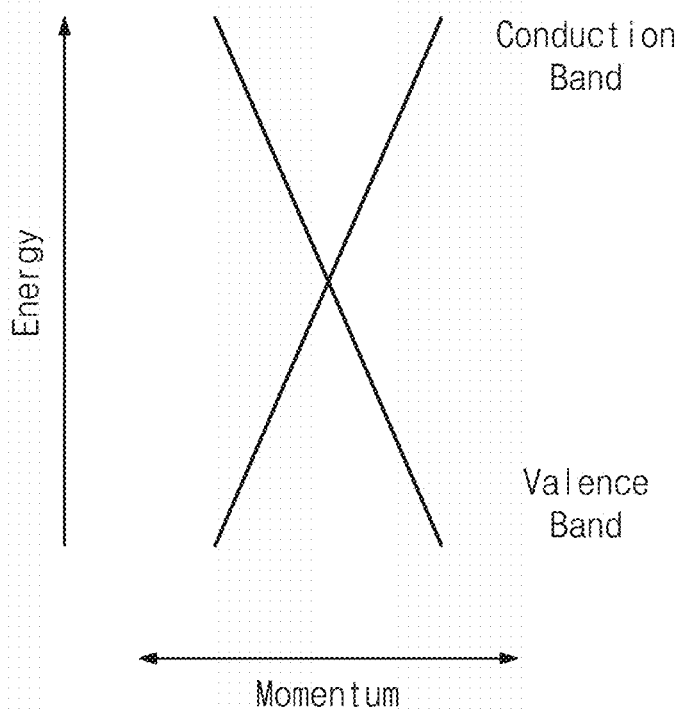

FIG. 8A
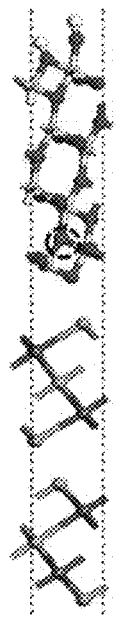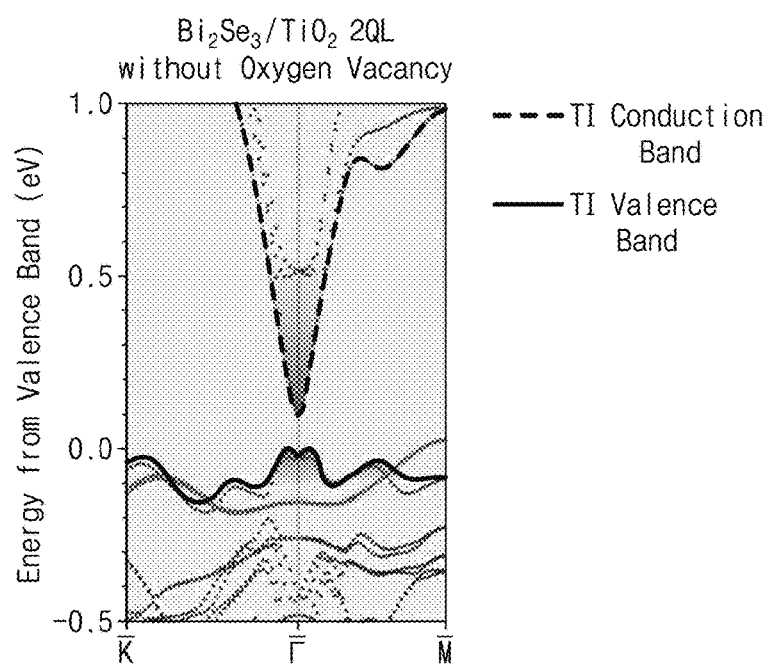
Bi$_2$Se$_3$/TiO$_2$ 2QL
without Oxygen Vacancy
- - - TI Conduction Band
—— TI Valence Band
FIG. 8B
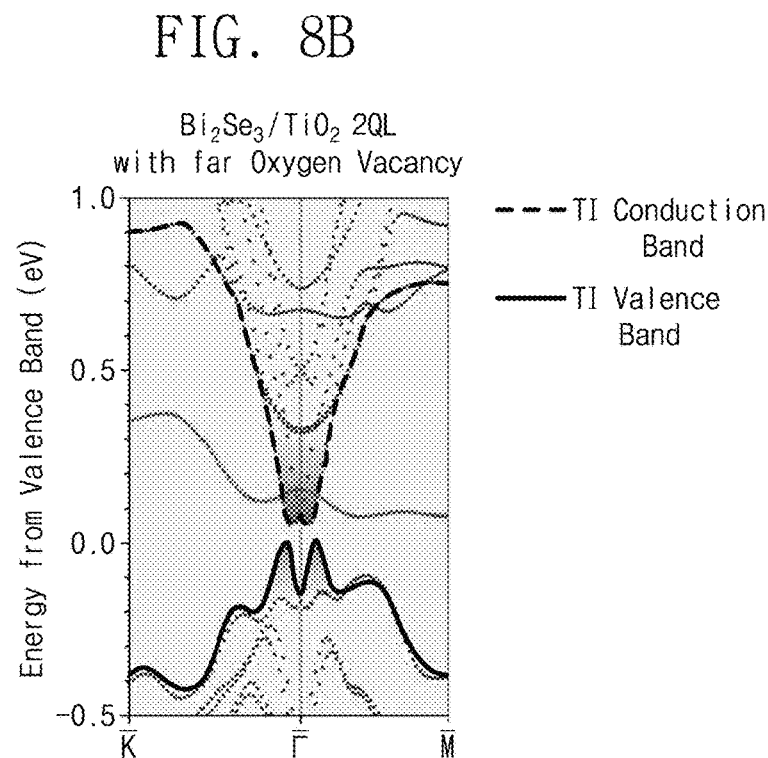
Bi$_2$Se$_3$/TiO$_2$ 2QL
with far Oxygen Vacancy
- - - TI Conduction Band
—— TI Valence Band

ELECTRONIC DEVICE INCLUDING TOPOLOGICAL INSULATOR AND TRANSITION METAL OXIDE

CROSS-REFERENCE TO RELATED APPLICATIONS

This U.S. non-provisional patent application claims priority under 35 U.S.C. § 119 to Korean Patent Application Nos. 10-2016-0123915, 10-2016-0129662, and 10-2017-0043179, filed on Sep. 27, 2016, Oct. 7, 2016, and Apr. 3, 2017, respectively, in the Korean Intellectual Property Office, the entire contents of which are hereby incorporated by reference.

BACKGROUND OF THE INVENTION

The present disclosure relates to an electronic device including a topological insulator and a transition metal oxide.

A topological insulator is a material that has a surface energy band called 'Dirac cone' and behaves as an insulator in its interior but has a conductive state on its surface. Many studies have been conducted to apply the topological insulator to an electronic device.

SUMMARY

Some embodiments of the inventive concept provide an electronic device with a topological insulator whose surface resistance state can be controlled.

According to some embodiments of the inventive concept, an electronic device may include a topological insulating layer including first and second surfaces facing each other and a transition metal oxide layer provided on the first surface of the topological insulating layer.

In some embodiments, the topological insulating layer may have a thickness ranging from 1 nm to 10 nm.

In some embodiments, the topological insulating layer may contain a compound represented by a chemical formula $A_XB_YC_ZD_W$, where $0<X\leq10$, $0<Y\leq10$, $0<Z\leq10$, and $0<W\leq10$. Each of A and B may be Bi, Sb, Tl, Pb, Sn, In, Ga, or Ge, and each of C and D may be Se, Te, or S.

In some embodiments, the transition metal oxide layer may be in contact with the first surface.

In some embodiments, the electronic device may further include a gate electrode provided on the transition metal oxide layer. The gate electrode may be configured to apply a voltage to the transition metal oxide layer.

In some embodiments, a density of oxygen vacancies in the transition metal oxide layer may be controlled by the voltage.

In some embodiments, a charge state of oxygen vacancies in the transition metal oxide layer may be controlled by the voltage.

In some embodiments, the electronic device may further include first and second source/drain electrodes provided on the second surface. The second surface may include a portion that is located between the first and second source/drain electrodes and is used as a channel region, and the transition metal oxide layer may be overlapped with at least a portion of the channel region, when viewed in a plan view.

In some embodiments, the electronic device may further include first and second source/drain electrodes provided on the first surface. The first and second source/drain electrodes may be spaced apart from each other with the transition metal oxide layer interposed therebetween.

In some embodiments, the transition metal oxide layer may include a first sub-oxide layer and a second sub-oxide layer, and a density of oxygen vacancies in the first sub-transition metal oxide layer may be less than a density of oxygen vacancies in the second sub-transition metal oxide layer.

According to some embodiments of the inventive concept, an electronic device may include a topological insulating layer having a surface, a portion of which is used as a channel region, a transition metal oxide layer overlapped with the channel region, when viewed in a plan view, and a gate electrode provided on the transition metal oxide layer. The gate electrode may be configured to apply a voltage to the transition metal oxide layer.

In some embodiments, the topological insulating layer may have a thickness ranging from 1 nm to 10 nm.

In some embodiments, resistance of the channel region may be controlled by the voltage.

In some embodiments, a density of oxygen vacancies in the transition metal oxide layer may be controlled by the voltage.

In some embodiments, a charge state of oxygen vacancies in the transition metal oxide layer may be controlled by the voltage.

According to some embodiments of the inventive concept, an electronic device may include a topological insulating layer having first and second surfaces facing each other, first and second source/drain electrodes spaced apart from each other on the first surface, the first surface having a portion that is positioned between the first and second source/drain electrodes and is used as a channel region, a transition metal oxide layer provided on the first or second surface of the topological insulating layer, the transition metal oxide layer being overlapped with at least a portion of the channel region, when viewed in a plan view, and a gate electrode provided on the transition metal oxide layer.

In some embodiments, the topological insulating layer may have a thickness ranging from 1 nm to 10 nm.

In some embodiments, the gate electrode may be configured to apply a voltage to the transition metal oxide layer, and a resistance state of the channel region may be controlled by the voltage applied to the transition metal oxide layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a perspective view illustrating an electronic device according to some embodiments of the inventive concept.

FIG. 2A is an energy band diagram of a channel region of an electronic device according to some embodiments of the inventive concept, when the electronic device is in an off state.

FIG. 2B is an energy band diagram of a channel region of an electronic device according to some embodiments of the inventive concept, when the electronic device is in an on state.

FIGS. 8A to 8D are graphs showing simulation results for a change in surface state of a topological insulating layer, due to the presence or absence of oxygen vacancy in a transition metal oxide layer.

Figure 3A:
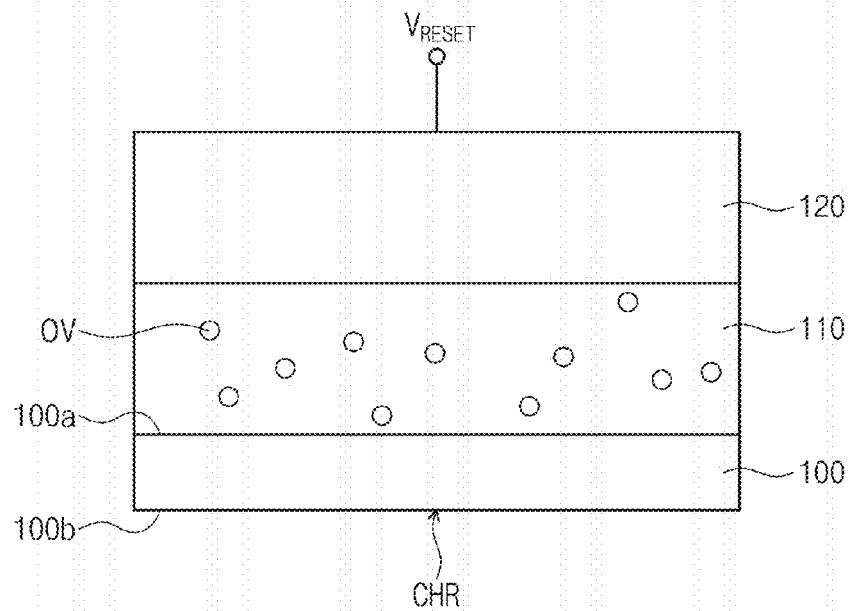
FIGS. 3A and 3B are diagrams illustrating an example of controlling an on/off state of an electronic device, according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating an electronic device according to some embodiments of the inventive concept. Hereinafter, a structure of an electronic device according to some embodiments of the inventive concept will be described with reference to FIG. 1.

Referring to FIG. 1, according to some embodiments of the inventive concept, an electronic device 10 may include a topological insulating layer 100, a transition metal oxide layer 110, a gate electrode 120, and first and second source/drain electrodes 130 and 132.

The topological insulating layer 100 may have a surface and an interior portion 100$i$. The surface of the topological insulating layer 100 may include a first surface 100$a$ and a second surface 100$b$ that are opposite to each other. When viewed in a vertical section, the interior portion 100$i$ of the topological insulating layer 100 may be located between the first and second surfaces 100$a$ and 100$b$.

The topological insulating layer 100 may include a topological insulator (TI). The topological insulator may refer to a material that exhibits an insulating property in its interior but a conductive property on its surface, when it has a sufficient thickness (e.g., larger than 10 QL (quintuple layer)). That is, if a topological insulator has a sufficient thickness, an interior portion thereof may have an energy band gap and a surface thereof may not have an energy band gap.

The topological insulator may be a compound, which is represented by the chemical formula of $A_xB_yC_zD_w$, where $0<X\leq10$, $0<Y\leq10$, $0<Z\leq10$, and $0<W\leq10$. Here, each of A and B may be an element selected from the group consisting of Bi, Sb, Tl, Pb, Sn, In, Ga, or Ge, and each of C and D may be an element selected from the group consisting of Se, Te, or S. For example, the topological insulator may be a compound, which is represented by a chemical formula $A_{1-X}B_XC_{1-Y}D_Y$ (where $0<X\leq1$ and $0<Y\leq1$), a chemical formula $A_{2-X}B_XC_{3-Y}D_Y$ (where $0<X\leq2$ and $0<Y\leq3$), a chemical formula $A_{3-X}B_XC_{4-Y}D_Y$ (where $0<X\leq3$ and $0<Y\leq4$), or a chemical formula $A_{5-X}B_XC_{7-Y}D_Y$ (where $0<X\leq5$ and $0<Y\leq7$). Each of A and B may be an element selected from the group consisting of Bi, Sb, Tl, Pb, Sn, In, Ga, or Ge, and each of C and D may be an element selected from the group consisting of Se, Te, or S. In certain embodiments, the topological insulator may be formed of or include $Bi_2Se_3$, $Bi_2Te_3$, $Ge_2Se_2Te_5$, $Sb_2Te_3$, $Sb_2Se_3$, $Bi_2Te_2Se$, $Bi_2Te_{1.6}S_{1.4}$, $Bi_{1.1}Sb_{0.9}Te_2S$, $Bi_{1.5}Sb_{0.5}Te_{1.7}Se_{1.3}$, $TlBiSe_2$, $TlBiTe_2$, $TlBi(S_{1-X}Se_X)_2$, $PbBi_2Te_4$, $PbSb_2Te_4$, $GeBi_2Te_4$, or $PbBi_4Te_7$.

If a topological insulator has a sufficient thickness, a surface of the topological insulator may have a Dirac cone surface state. In such a sufficiently thick topological insulator, an overlapping between surface-state wave functions of first and second surfaces (e.g., top and bottom surfaces) may be negligibly small.

The topological insulating layer 100 may have a thickness 100t ranging from about 1 QL to about 10 QL. For example, the thickness 100t of the topological insulating layer 100 may range from about 1 nm to about 10 nm. The thickness 100t of the topological insulating layer 100 may be defined as a distance between the first and second surfaces 100a and 100b. In the case where the thickness 100t of the topological insulating layer 100 is sufficiently small, surface-state wave functions of the first and second surfaces 100a and 100b may be overlapped to each other and may be affected by each other.

The transition metal oxide layer 110 may be provided on the first surface 100a of the topological insulating layer 100. The transition metal oxide layer 110 may be placed adjacent to the first surface 100a. In some embodiments, as shown in FIG. 1, the transition metal oxide layer 110 may be in contact with the first surface 100a. But the inventive concept is not limited thereto. In certain embodiments, unlike that shown in FIG. 1, an additional layer (not shown) may be provided between the transition metal oxide layer 110 and the first surface 100a. The transition metal oxide layer 110 may have a thickness ranging from about 1 nm to about 100 nm.

The transition metal oxide layer 110 may contain oxide of at least one selected from the group consisting of titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), technetium (Tc), ruthenium (Ru), cadmium (Cd), hafnium (Hf), tantalum (Ta), iridium (Ir), tungsten (W), lanthanum (La), cerium (Ce), and gadolinium (Gd).

The transition metal oxide layer 110 may include oxygen vacancies and unpaired electrons adjacent thereto. For example, the transition metal oxide layer 110 may have oxygen vacancies from where oxygen atoms are removed (i.e., oxygen-deficient sites), and transition metal atoms adjacent to the oxygen vacancies may have unpaired electrons. The unpaired electrons in the transition metal oxide layer 110 may affect a surface state of the topological insulating layer 100 adjacent thereto.

A density of unpaired electrons in the transition metal oxide layer 110 may be changed depending on a density and/or a charge state of oxygen vacancies in the transition metal oxide layer 110. As an example, a density of unpaired electrons in the transition metal oxide layer 110 may be proportional to a density of oxygen vacancies in the transition metal oxide layer 110. As another example, a density of unpaired electrons in the transition metal oxide layer 110 may be changed depending on a charge state of oxygen vacancies in the transition metal oxide layer 110.

The gate electrode 120 may be provided on the transition metal oxide layer 110. The gate electrode 120 may be formed of or include a conductive material. For example, the gate electrode 120 may include at least one of metals, metal nitrides, or doped semiconductor materials. A voltage may be applied to the transition metal oxide layer 110 through the gate electrode 120. The voltage may be changed to control a density and/or a charge state of oxygen vacancies in the transition metal oxide layer 110 and moreover to control a density of unpaired electrons in the transition metal oxide layer 110.

The first and second source/drain electrodes 130 and 132 may be provided on the surface of the topological insulating layer 100. In some embodiments, as shown in FIG. 1, the first and second source/drain electrodes 130 and 132 may be provided on the second surface 100b. But the inventive concept is not limited thereto. In certain embodiments, unlike that shown in FIG. 1, the first and second source/drain electrodes 130 and 132 may be provided on the first surface 100a.

The first and second source/drain electrodes 130 and 132 may be spaced apart from each other. A surface of a portion of the topological insulating layer 100, which is located between the first and second source/drain electrodes 130 and 132, may be defined as a channel region CHR. For example, in the structure of FIG. 1, the second surface 100b between the first and second source/drain electrodes 130 and 132 may be defined as the channel region CHR.

The first and second source/drain electrodes 130 and 132 may be coupled to each other through the channel region CHR. Accordingly, electric resistance between the first and second source/drain electrodes 130 and 132 may be determined by electric resistance of the channel region CHR. For example, if the resistance between the first and second source/drain electrodes 130 and 132 (i.e., of the channel region CHR) is high, the electronic device 10 may be defined to be in an off state. By contrast, when the resistance between the first and second source/drain electrodes 130 and 132 (i.e., of the channel region CHR) is low, the electronic device 10 may be defined to be in an on state.

The transition metal oxide layer 110 may be positioned adjacent to the channel region CHR. For example, when viewed in a plan view, the transition metal oxide layer 110 may be overlapped with at least a portion of the channel region CHR. In some embodiments, as shown in FIG. 1, when viewed in a plan view, the transition metal oxide layer 110 may be confined within the channel region CHR. But the inventive concept is not limited thereto. In certain embodiments, unlike that shown in FIG. 1, when viewed in a plan view, the transition metal oxide layer 110 may extend beyond the channel region CHR.

The first and second source/drain electrodes 130 and 132 may be formed of or include a conductive material. For example, the first and second source/drain electrodes 130 and 132 may include at least one of metals, metal nitrides, or doped semiconductor materials.

FIG. 2A is an energy band diagram of a channel region of an electronic device according to some embodiments of the inventive concept, when the electronic device is in an off state. FIG. 2B is an energy band diagram of a channel region of an electronic device according to some embodiments of the inventive concept, when the electronic device is in an on state. Hereinafter, on- and off states of an electronic device according to some embodiments of the inventive concept will be described with reference to FIGS. 1, 2A, and 2B.

Referring to FIG. 1, a surface state and a resulting resistance of the channel region CHR may be dependent on a density of unpaired electrons (or a density and/or a charge state of oxygen vacancies) in the transition metal oxide layer 110. That is, an on/off state of the electronic device 10 may be dependent on a density of unpaired electrons in the transition metal oxide layer 110 (or a density and/or a charge state of oxygen vacancies).

Referring to FIGS. 1 and 2A, when a density of unpaired electrons in the transition metal oxide layer 110 is low, the electronic device 10 may be in an off state. That is, when a density of unpaired electrons in the transition metal oxide layer 110 is low, the channel region CHR may have high resistance.

Since the thickness 100t of the topological insulating layer 100 is thin (e.g., from about 1 QL to about 10 QL), surface states of the first and second surfaces 100a and 100b may be coupled to each other. For example, there may be hybridization between surface-state wave functions of the first and second surfaces 100a and 100b. Accordingly, the Dirac cone surface state of the first and second surfaces 100a and 100b may be broken, and thus, the first and second surfaces 100a and 100b may have an energy band gap. The channel region CHR may be a part of the second surface 100b (in certain embodiments, a part of the first surface 100a), and in this case, as shown in FIG. 2A, the channel region CHR may have a broken Dirac cone surface state and have an energy band gap. That is, when a density of unpaired electrons in the transition metal oxide layer 110 is low, the channel region CHR may have high resistance, and the electronic device 10 may be in an off state.

Referring to FIGS. 1 and 2B, when a density of unpaired electrons in the transition metal oxide layer 110 is high, the electronic device 10 may be in an on state. That is, when a density of unpaired electrons in the transition metal oxide layer 110 is high, the channel region CHR may have low resistance.

Unpaired electrons in the transition metal oxide layer 110 may contribute to enhance a spin-orbit coupling of the topological insulating layer 100 adjacent thereto. The higher the density of unpaired electrons are in the transition metal oxide layer 110 and the closer the unpaired electrons are to the topological insulating layer 100, the more the unpaired electrons may enhance the spin-orbit coupling of the topological insulating layer 100.

If the spin-orbit coupling of the topological insulating layer 100 is enhanced, a coupling between surface states of the first and second surfaces 100a and 100b may become weak. For example, the hybridization between the surface-state wave functions of the first and second surfaces 100a and 100b may be weakened or disappear. Accordingly, the Dirac cone surface state may be restored in the first and second surfaces 100a and 100b adjacent to the transition metal oxide layer 110, and the first and second surfaces 100a and 100b adjacent to the transition metal oxide layer 110 may have an energy band gap no longer. Since the transition metal oxide layer 110 is provided adjacent to the channel region CHR, if a density of unpaired electrons in the transition metal oxide layer 110 is increased, the Dirac cone surface state of the channel region CHR may be restored and the channel region CHR may not have an energy band gap, as shown in FIG. 2B. That is, in the case where a density of unpaired electrons in the transition metal oxide layer 110 is high, the channel region CHR may have low resistance and the electronic device 10 may be in an on state.

Figure 3B:
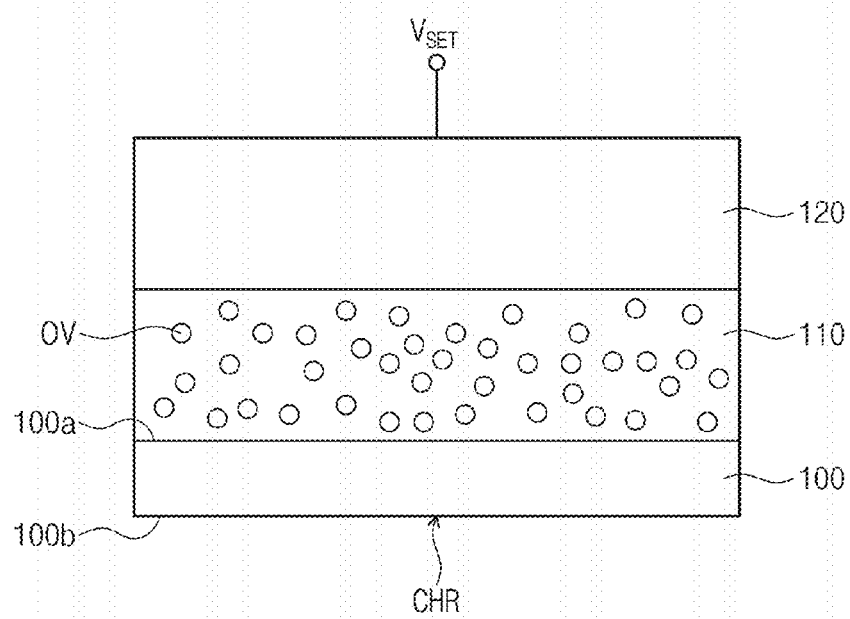

FIGS. 3A and 3B are diagrams illustrating an example of controlling an on/off state of an electronic device, according to some embodiments of the inventive concept.

Referring to FIGS. 1, 3A, and 3B, the transition metal oxide layer 110 may include oxygen vacancies OV. An on/off state of the electronic device 10 may be changed by controlling a density of the oxygen vacancies OV in the transition metal oxide layer 110. In other words, by controlling a density of oxygen vacancies OV in the transition metal oxide layer 110, it may be possible to control a resistance state of the channel region CHR. The density of the oxygen vacancies OV in the transition metal oxide layer 110 may be changed by applying a voltage to the transition metal oxide layer 110 through the gate electrode 120.

A density of unpaired electrons in the transition metal oxide layer 110 may be proportional to a density of oxygen vacancies OV in the transition metal oxide layer 110. That is, if a density of oxygen vacancies OV in the transition metal oxide layer 110 is low, a density of unpaired electrons in the transition metal oxide layer 110 may also be low. By contrast, if a density of oxygen vacancies OV in the transition metal oxide layer 110 is high, a density of unpaired electrons in the transition metal oxide layer 110 may also be high.

As shown in FIG. 3A, in the case where a density of oxygen vacancies OV in the transition metal oxide layer 110 is low, the channel region CHR may have high resistance, and the electronic device 10 may be in an off state.

If a voltage $V_{SET}$ corresponding to a set voltage is applied to the transition metal oxide layer 110 including low-density oxygen vacancies OV, a density of oxygen vacancies OV in the transition metal oxide layer 110 may be increased, as shown in FIG. 3B, and thus, a density of unpaired electrons in the transition metal oxide layer 110 may also be increased. Thus, if the voltage $V_{SET}$ corresponding to the set voltage is applied to the transition metal oxide layer 110 including low-density oxygen vacancies OV, the channel region CHR may have low resistance, and the electronic device 10 may be switched to an on state.

If a voltage $V_{RESET}$ corresponding to a reset voltage is applied to the transition metal oxide layer 110 including high-density oxygen vacancies OV, a density of oxygen vacancies OV in the transition metal oxide layer 110 may be lowered, as shown in FIG. 3A, and thus, a density of unpaired electrons in the transition metal oxide layer 110 may also be lowered. Thus, if the voltage $V_{RESET}$ corresponding to the reset voltage is applied to the transition metal oxide layer 110 including high-density oxygen vacancies OV, the channel region CHR may have high resistance, and the electronic device 10 may be switched to an off state.

Figure 4A:
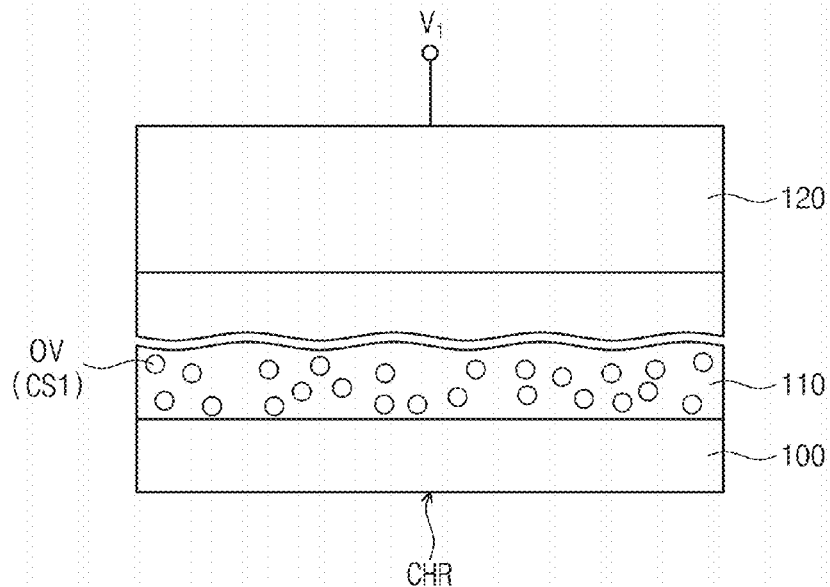
FIGS. 4A and 4B are diagrams illustrating another example of controlling an on/off state of an electronic device, according to some embodiments of the inventive concept.
Figure 4B:
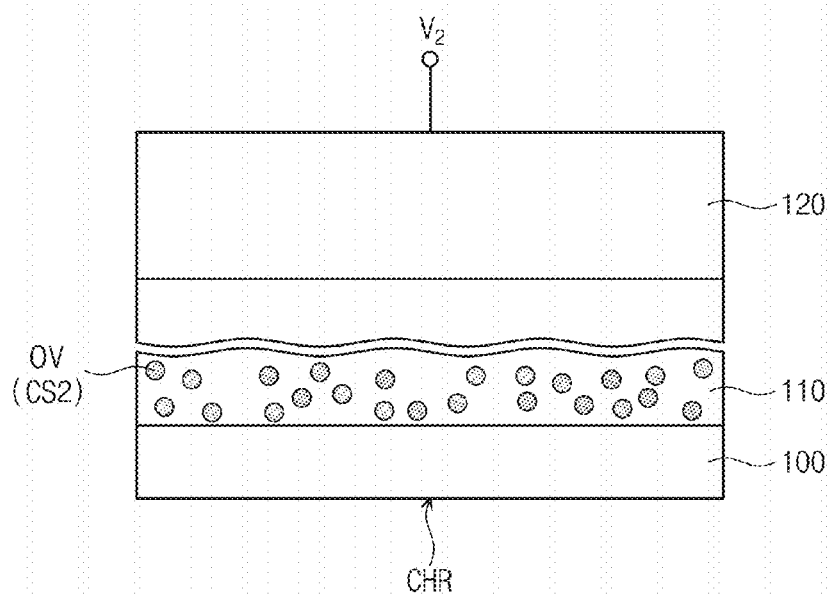

FIGS. 4A and 4B are diagrams illustrating another example of controlling an on/off state of an electronic device, according to some embodiments of the inventive concept.

Referring to FIGS. 1, 4A, and 4B, the transition metal oxide layer 110 may include the oxygen vacancies OV. An on/off state of the electronic device 10 may be controlled by controlling a charge state of some of the oxygen vacancies OV, which are located adjacent to the topological insulating layer 100. In other words, by controlling a charge state of the oxygen vacancies OV adjacent to the topological insulating layer 100, it may be possible to control a resistance state of the channel region CHR.

If a voltage applied to the transition metal oxide layer 110 through the gate electrode 120 is changed, a portion of the transition metal oxide layer 110 adjacent to the topological insulating layer 100 may have a changed Fermi level, and thus, a charge state of the oxygen vacancies OV adjacent to the topological insulating layer 100 may be changed. As an example, if a positive voltage is applied to the transition metal oxide layer 110 through the gate electrode 120, the portion of the transition metal oxide layer 110 adjacent to the topological insulating layer 100 may have a lowered Fermi level, and thus, the oxygen vacancies OV adjacent to the topological insulating layer 100 may have a positively charged state (e.g., of +2 or +1). As another example, if a negative voltage is applied to the transition metal oxide layer 110 through the gate electrode 120, the portion of the transition metal oxide layer 110 adjacent to the topological insulating layer 100 may have an elevated Fermi level, and thus, the oxygen vacancies OV adjacent to the topological insulating layer 100 may have a negatively charged state (e.g., of −2 or −1). As other example, if an absolute value of a voltage applied to the transition metal oxide layer 110 through the gate electrode 120 is reduced, the oxygen vacancies OV may have a neutral charge state.

An amount of unpaired electrons, which are produced by the oxygen vacancies OV, may be changed by a charge state of the oxygen vacancies OV, and thus, by controlling a charge state of the oxygen vacancies OV adjacent to the topological insulating layer 100, it may be possible to control an on/off state of the electronic device 10 (or a resistance state of the channel region CHR). A magnitude of a voltage V1 or V2 to be applied to control a charge state of the oxygen vacancies OV adjacent to the topological insulating layer 100 may be less than that of the set and reset voltages and described with reference to FIGS. 3A and 3B.

For example, as shown in FIG. 4A, if a first voltage V1 is applied to the gate electrode 120, the oxygen vacancies OV adjacent to the topological insulating layer 100 may have a first charge state CS1 which may produce relatively few unpaired electrons. As shown in FIG. 4B, if a second voltage V2 applied to the gate electrode 120 is different from the first voltage V1, the oxygen vacancies OV adjacent to the topological insulating layer 100 may have a second charge state CS2 producing relatively many unpaired electrons, compared with the oxygen vacancies OV of the first charge state CS1. Accordingly, in the case where, as shown in FIG. 4A, the first voltage V1 is applied to the gate electrode 120, the channel region CHR may have high resistance and the electronic device 10 may be in an off state. By contrast, in the case where, as shown in FIG. 4B, the second voltage V2 is applied to the gate electrode 120, the channel region CHR may have low resistance and the electronic device 10 may be in an on state. That is, by controlling a voltage applied to the transition metal oxide layer 110 through the gate electrode 120, it may be possible to control an on/off state of the electronic device 10.

Figure 4C:
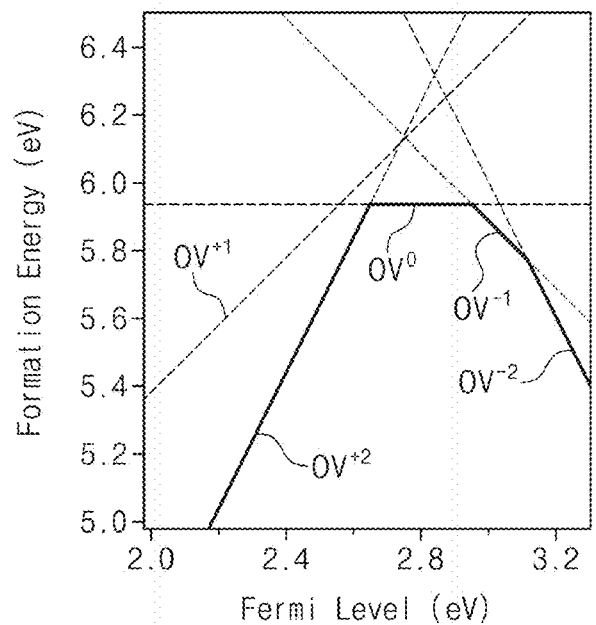
FIG. 4C is a graph showing a change in charge state of oxygen vacancies which is caused by a change in Fermi level of the titanium oxide.
Figure 4D:
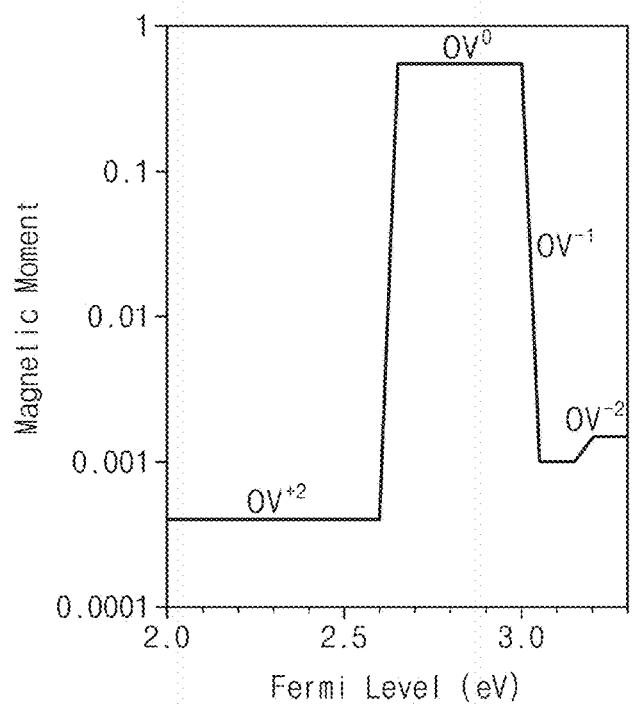
FIG. 4D is a graph showing a change in magnetic moment which is caused by a change in charge state of oxygen vacancies of the titanium oxide.

FIG. 4C is a graph showing a change in charge state of oxygen vacancies which is caused by a change in Fermi level of the titanium oxide. FIG. 4D is a graph showing a change in magnetic moment which is caused by a change in charge state of oxygen vacancies of the titanium oxide. Hereinafter, an example, in which the transition metal oxide layer 110 containing titanium oxide is used, will be described in more detail with reference to FIGS. 4C and 4D.

FIG. 4C shows that, in the case where a Fermi level of titanium oxide increases, the oxygen vacancies OV may have various charge states of +2, 0 (neutral), −1, and −2. That is, in the case where a voltage applied to the gate electrode 120 is gradually changed from a positive voltage to a negative voltage, the charge state of the oxygen vacancies OV may be changed to one of +2, 0 (neutral), −1, or −2.

As shown in FIG. 4D, when the oxygen vacancies OV have a charge state of 0 (neutral), titanium oxide has the highest magnetic moment. When the oxygen vacancies OV have a charge state of +2, −1, or −2, the magnetic moment of titanium oxide has a relatively small value. The higher the magnetic moment of titanium oxide, the higher a density of unpaired electrons in titanium oxide. Thus, when a charge state of oxygen vacancies in titanium oxide is 0 (neutral), a density of unpaired electrons in titanium oxide may be highest, and when a charge state of oxygen vacancies in titanium oxide is +2, −1, or −2, the magnetic moment may be relatively small.

In conclusion, when the transition metal oxide layer 110 contains titanium oxide, a voltage applied to the gate electrode 120 may be controlled to allow the oxygen vacancies OV to have a charge state of 0 (neutral), and in this case, the electronic device 10 may become an on state. Furthermore, when the transition metal oxide layer 110 contains titanium oxide, a voltage applied to the gate electrode 120 may be controlled to allow the oxygen vacancies OV to have a charge state of +2, −1, or −2, and in this case, the electronic device 10 may become an off state.

Figure 5A:
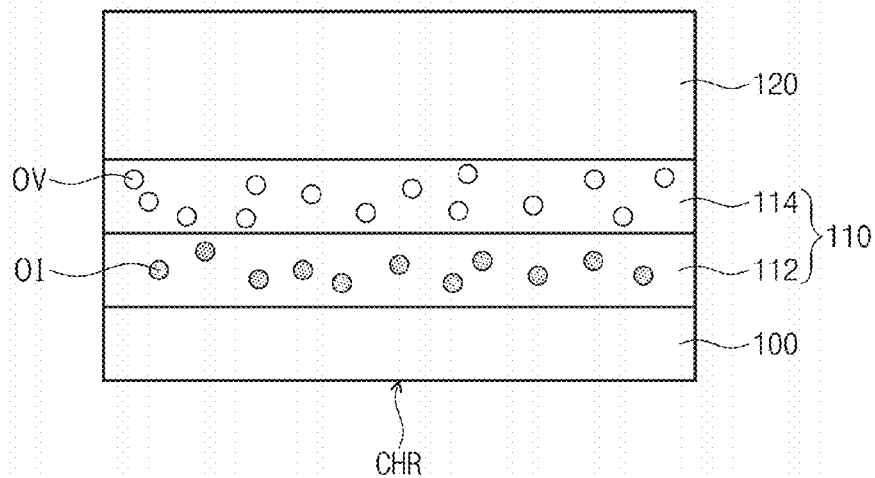
FIGS. 5A to 5C are diagrams illustrating other example of controlling an on/off state of an electronic device according to some embodiments of the inventive concept.
Figure 5B:
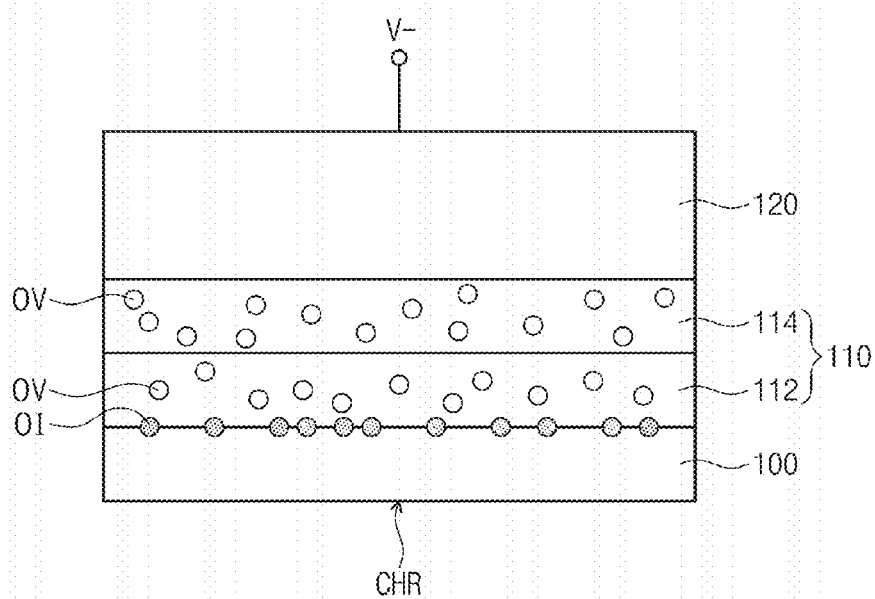
Figure 5C:
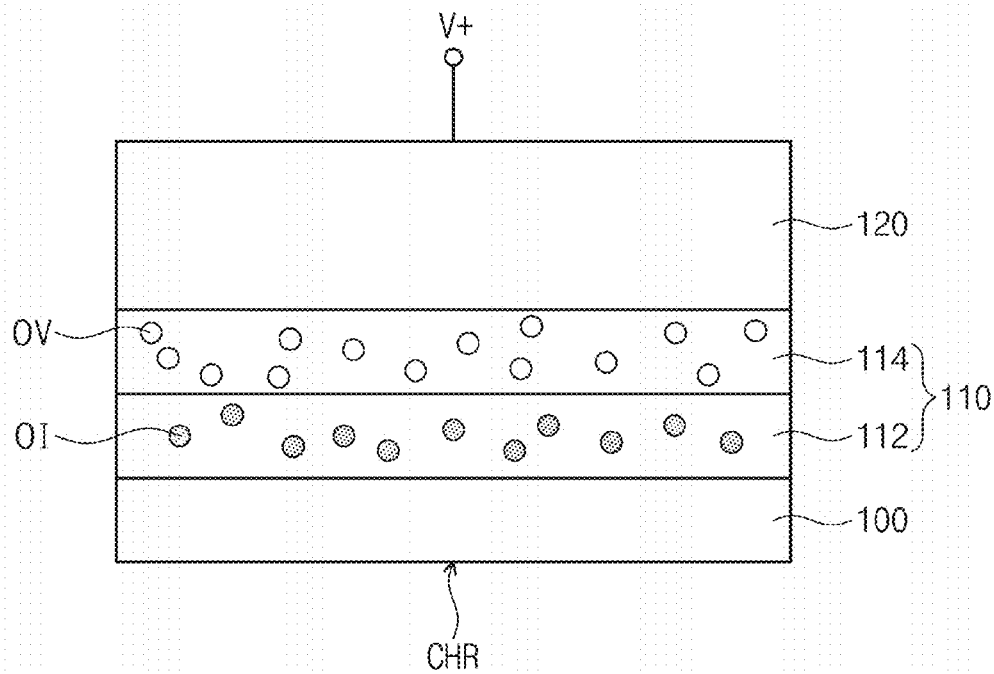

FIGS. 5A to 5C are diagrams illustrating other example of controlling an on/off state of an electronic device according to some embodiments of the inventive concept. FIG. 5A illustrates an electronic device before applying a voltage to a gate electrode. FIG. 5B illustrates an electronic device when a negative voltage is applied to a gate electrode. FIG. 5C illustrates an electronic device when a positive voltage is applied to a gate electrode.

Referring to FIGS. 1 and 5A, the transition metal oxide layer 110 may include a first sub-oxide layer 112 and a second sub-oxide layer 114. The second sub-oxide layer 114 may have an oxygen vacancy density higher than that of the first sub-oxide layer 112. In other words, the number of oxygen vacancies OV may be higher in the second sub-oxide layer 114 than in the first sub-oxide layer 112, and the number of oxygen ions OI may be higher in the first sub-oxide layer 112 than in the second sub-oxide layer 114. For example, the first sub-oxide layer 112 may be a transition metal oxide layer which is formed at a relatively high oxygen partial pressure, and the second sub-oxide layer 114 may be a transition metal oxide layer which is formed at a relatively low oxygen partial pressure. When a voltage is applied to the gate electrode 120, oxygen ions OI may have mobility higher than that of the oxygen vacancies OV.

The first sub-oxide layer 112 may be provided adjacent to the topological insulating layer 100. In other words, the first sub-oxide layer 112 may be provided between the topological insulating layer 100 and the second sub-oxide layer 114, and the second sub-oxide layer 114 may be provided between the first sub-oxide layer 112 and the gate electrode 120. Accordingly, an on/off state of the electronic device 10 may be changed depending on a density of unpaired electrons of the first sub-oxide layer 112.

Referring to FIGS. 1 and 5B, if a negative voltage V− is applied to the gate electrode 120, the electronic device 10 may be in an on state.

If the negative voltage V− is applied to the gate electrode 120, oxygen ions OI of the first sub-oxide layer 112 may be moved toward an interface between the first sub-oxide layer 112 and the topological insulating layer 100, and oxygen vacancies OV may be produced in the first sub-oxide layer 112. Accordingly, a density of the oxygen vacancies OV and a density of unpaired electrons in the first sub-oxide layer 112 may be increased. As a result, the channel region CHR may have low resistance, and the electronic device 10 may be in an on state.

Referring to FIGS. 1 and 5C, if a positive voltage V+ is applied to the gate electrode 120, the electronic device 10 may be in an off state.

If a positive voltage V+ is applied to the gate electrode 120, oxygen ions OI, which are moved toward an interface between the first sub-oxide layer 112 and the topological insulating layer 100, may be returned into the first sub-oxide layer 112, and the oxygen vacancies OV in the first sub-oxide layer 112 may disappear. Accordingly, a density of the oxygen vacancies OV and a density of unpaired electrons in the first sub-oxide layer 112 may be decreased. As a result, the channel region CHR may high resistance, and the electronic device 10 may be in an off state.

Figure 6A:
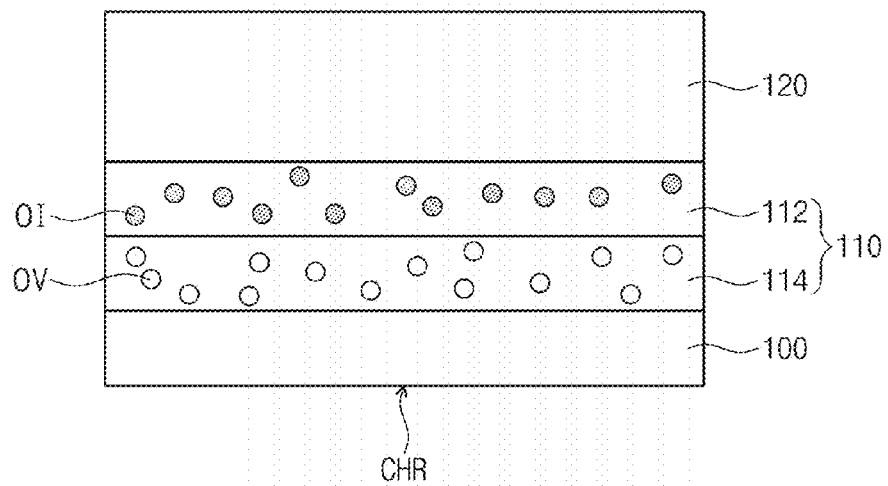
FIGS. 6A to 6C are diagrams illustrating still other example of controlling an on/off state of an electronic device according to some embodiments of the inventive concept.
Figure 6B:
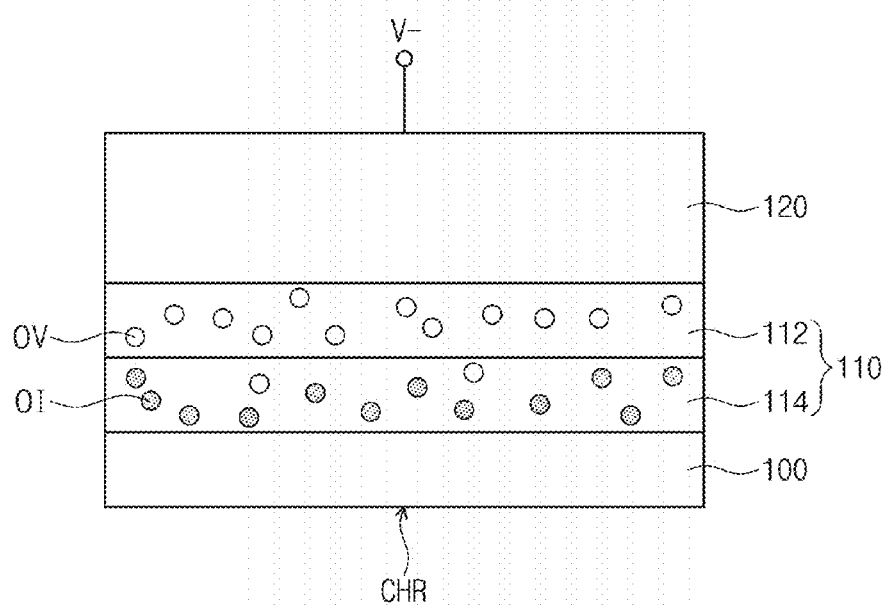
Figure 6C:
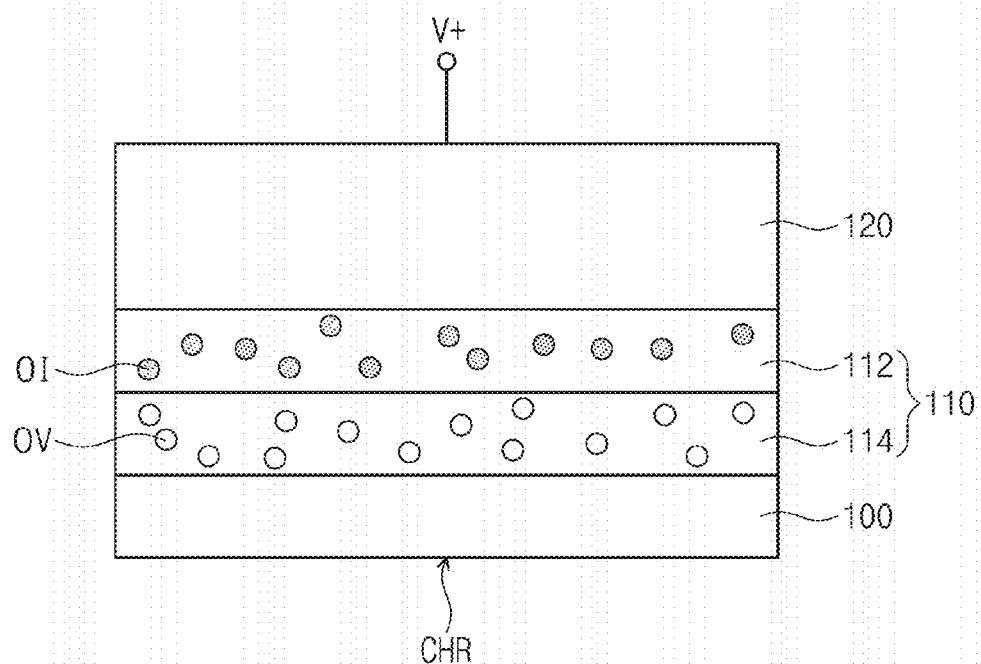

FIGS. 6A to 6C are diagrams illustrating still other example of controlling an on/off state of an electronic device according to some embodiments of the inventive concept. FIG. 6A illustrates an electronic device before applying a voltage to a gate electrode. FIG. 6B illustrates an electronic device when a negative voltage is applied to a gate electrode. FIG. 6C illustrates an electronic device when a positive voltage is applied to a gate electrode.

Referring to FIGS. 1 and 6A, the transition metal oxide layer 110 may include the first sub-oxide layer 112 and the second sub-oxide layer 114. The second sub-oxide layer 114 may have an oxygen vacancy density higher than that of the first sub-oxide layer 112. In other words, the number of oxygen vacancies OV may be higher in the second sub-oxide layer 114 than in the first sub-oxide layer 112, and the number of oxygen ions OI may be higher in the first sub-oxide layer 112 than in the second sub-oxide layer 114. When a voltage is applied to the gate electrode 120, oxygen ions OI may have mobility higher than that of the oxygen vacancies OV.

The second sub-oxide layer 114 may be provided adjacent to the topological insulating layer 100. In other words, the second sub-oxide layer 114 may be provided between the topological insulating layer 100 and the first sub-oxide layer 112, and the first sub-oxide layer 112 may be provided between the second sub-oxide layer 114 and the gate electrode 120. Accordingly, an on/off state of the electronic device 10 may be changed depending on a density of unpaired electrons of the second sub-oxide layer 114.

Referring to FIGS. 1 and 6B, if the negative voltage V− is applied to the gate electrode 120, the electronic device 10 may be in an off state.

If the negative voltage V− is applied to the gate electrode 120, oxygen ions OI of the first sub-oxide layer 112 may be moved toward the second sub-oxide layer 114, and vacancies OV in the second sub-oxide layer 114 may disappear. Accordingly, a density of the oxygen vacancies OV and a density of unpaired electrons in the second sub-oxide layer 114 may be decreased. As a result, the channel region CHR may have high resistance, and the electronic device 10 may be in an off state.

Referring to FIGS. 1 and 6C, if a positive voltage V+ is applied to the gate electrode 120, the electronic device 10 may be in an on state.

If the positive voltage V+ is applied to the gate electrode 120, oxygen ions OI moved toward the second sub-oxide layer 114 may be returned into the first sub-oxide layer 112, and the oxygen vacancies OV may be produced in the second sub-oxide layer 114. Accordingly, a density of the oxygen vacancies OV and a density of unpaired electrons in the second sub-oxide layer 114 may be increased. As a result, the channel region CHR may have low resistance, and the electronic device 10 may be in an on state.

Figure 7A:
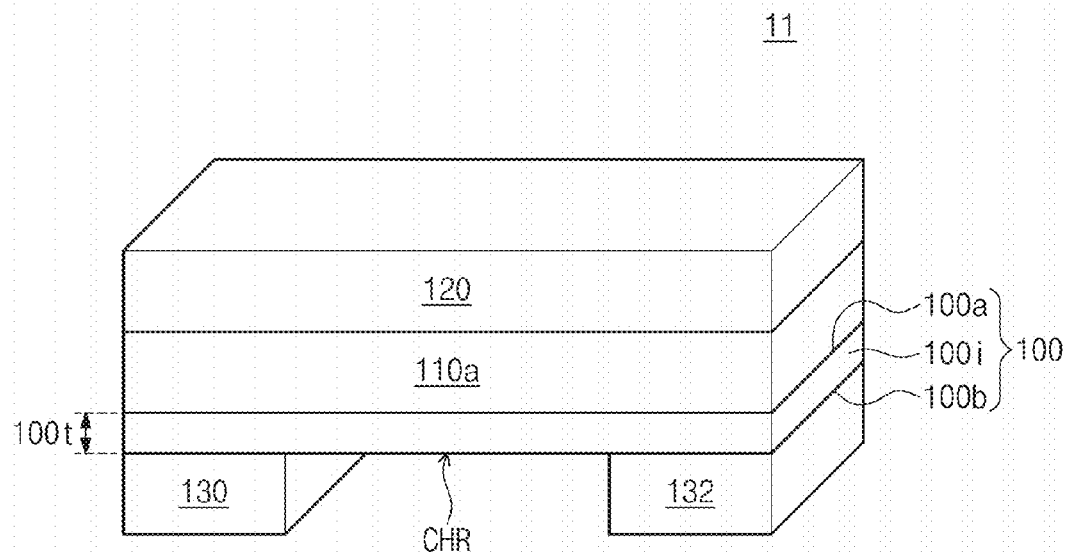
FIGS. 7A to 7C are perspective views illustrating an electronic device according to some embodiments of the inventive concept.

FIG. 7A is a perspective view illustrating an electronic device according to some embodiments of the inventive concept. In the following description, an element previously described with reference to FIG. 1 may be identified by a similar or identical reference number and an overlapping description thereof may not be repeated, for the sake of brevity.

Referring to FIG. 7A, according to some embodiments of the inventive concept, an electronic device 11 may include the topological insulating layer 100, the transition metal oxide layer 110a, the gate electrode 120, and the first and second source/drain electrodes 130 and 132. The topological insulating layer 100, the gate electrode 120, and the first and second source/drain electrodes 130 and 132 may be substantially the same as those of FIG. 1. Hereinafter, a difference between the transition metal oxide layer 110a of FIG. 7A and the transition metal oxide layer 110 of FIG. 1 will be mainly described.

The transition metal oxide layer 110a may be provided on the first surface 100a of the topological insulating layer 100. The transition metal oxide layer 110a may be provided adjacent to the channel region CHR. When viewed in a plan view, the transition metal oxide layer 110a may be overlapped with the channel region CHR and may extend beyond the channel region CHR. For example, when viewed in a plan view, the transition metal oxide layer 110a may be overlapped with the first and second source/drain electrodes 130 and 132.

Figure 7B:
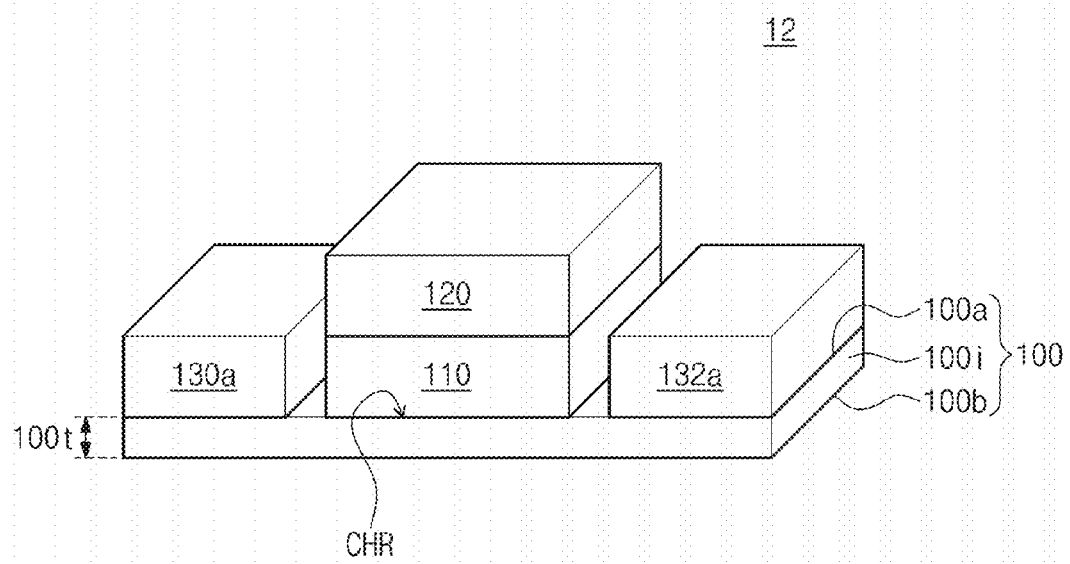

FIG. 7B is a perspective view illustrating an electronic device according to some embodiments of the inventive concept. In the following description, an element previously described with reference to FIG. 1 may be identified by a similar or identical reference number and an overlapping description thereof may not be repeated, for the sake of brevity.

Referring to FIG. 7B, according to some embodiments of the inventive concept, an electronic device 12 may include the topological insulating layer 100, the transition metal oxide layer 110, the gate electrode 120, and first and second source/drain electrodes 130a and 132a. The topological insulating layer 100, the transition metal oxide layer 110, and the gate electrode 120 may be substantially the same as that of FIG. 1. Hereinafter, a difference between the first and second source/drain electrodes 130a and 132a of FIG. 7B and the first and second source/drain electrodes 130 and 132 of FIG. 1 will be mainly described.

The first and second source/drain electrodes 130a and 132a and the transition metal oxide layer 110 may be provided on the same surface of the topological insulating layer 100. For example, the first and second source/drain electrodes 130a and 132a and the transition metal oxide layer 110 may be provided on the first surface 100a of the topological insulating layer 100. The first and second source/drain electrodes 130 and 132 may be spaced apart from each other with the transition metal oxide layer 110 interposed therebetween. Each of the first and second source/drain electrodes 130a and 132a may be spaced apart from the transition metal oxide layer 110. The first surface 100a between the first and second source/drain electrodes 130 and 132 may be defined as the channel region CHR.

Figure 7C:
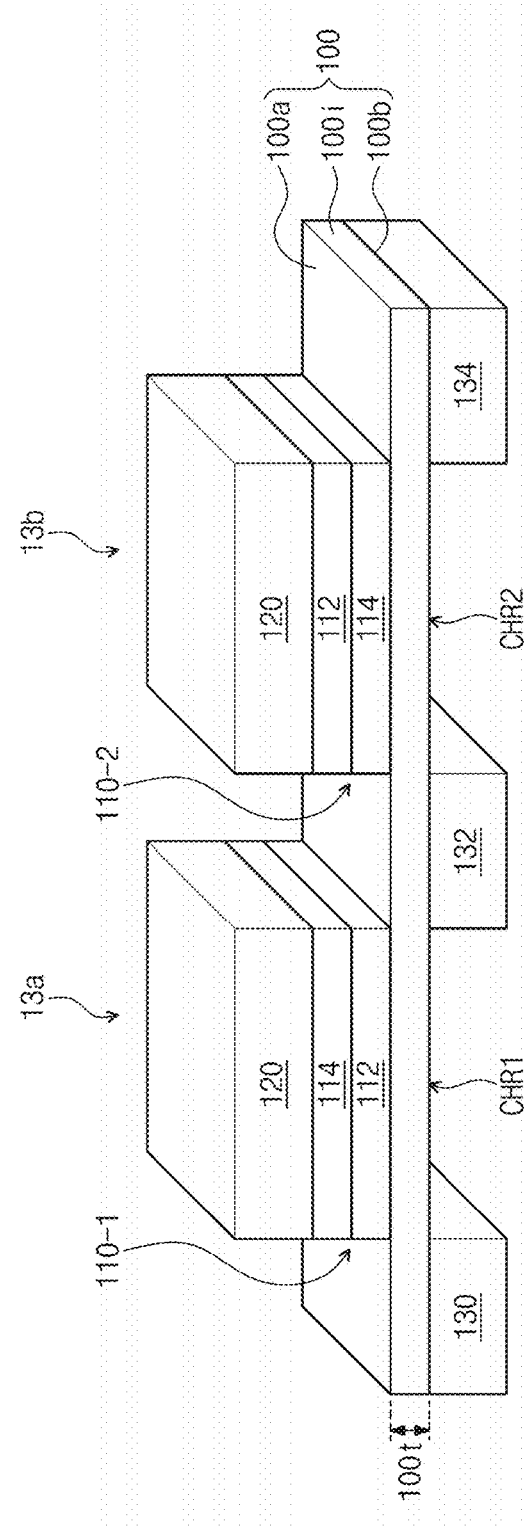

FIG. 7C is a perspective view illustrating an electronic device according to some embodiments of the inventive concept. In the following description, an element previously described with reference to FIG. 1 may be identified by a similar or identical reference number and an overlapping description thereof may not be repeated, for the sake of brevity.

Referring to FIG. 7C, according to some embodiments of the inventive concept, an electronic device 13 may include a topological insulating layer 100, first and second transition metal oxide layers 110-1 and 110-2, a pair of gate electrodes 120, and first to third source/drain electrodes 130, 132, and 134.

The topological insulating layer 100 may be substantially the same as that of FIG. 1.

On the first surface 100a of the topological insulating layer 100, the first and second transition metal oxide layers 110-1 and 110-2 may be provided to be spaced apart from each other. The first and second transition metal oxide layers 110-1 and 110-2 may be provided adjacent to the first surface 100a.

The first transition metal oxide layer 110-1 may be substantially the same as the transition metal oxide layer 110 described with reference to FIGS. 5A to 5C, and the second transition metal oxide layer 110-2 may be substantially the same as the transition metal oxide layer 110 described with reference to FIGS. 6A to 6C.

For example, each of the first and second transition metal oxide layers 110-1 and 110-2 may include the first sub-oxide layer 112 and the second sub-oxide layer 114. The first and second transition metal oxide layers 110-1 and 110-2 may differ from each other in terms of the order of stacking the first and second sub-oxide layers 112 and 114. The first sub-oxide layer 112 in the first transition metal oxide layer 110-1 may be provided adjacent to the topological insulating layer 100, and the second sub-oxide layer 114 in the second transition metal oxide layer 110-2 may be provided adjacent to the topological insulating layer 100.

The gate electrodes 120 may be provided on the transition metal oxide layers 110, respectively. Each of the gate electrodes 120 may be substantially the same as that of FIG. 1.

On the second surface 100b of the topological insulating layer 100, the first to third source/drain electrodes 130, 132, and 134 may be provided to be spaced apart from each other. The second source/drain electrode 132 may be provided between the first and third source/drain electrodes 130 and 134.

A portion of the second surface 100b positioned between the first and second source/drain electrodes 130 and 132 may be defined as a first channel region CHR1, and a portion of the second surface 100b positioned between the second and third source/drain electrodes 132 and 134 may be defined as a second channel region CHR2.

The first transition metal oxide layer 110-1 may be placed adjacent to the first channel region CHR1. For example, when viewed in a plan view, the first transition metal oxide layer 110-1 may be overlapped with at least a portion of the first channel region CHR1.

The second transition metal oxide layers 110-2 may be placed adjacent to the second channel region CHR2. For example, when viewed in a plan view, the second transition metal oxide layer 110-2 may be overlapped with at least a portion of the second channel region CHR2.

The first channel region CHR1, the first and second source/drain electrodes 130 and 132, the first transition metal oxide layer 110-1, and the gate electrode 120 thereon may constitute a first sub-electronic device 13a. Similarly, the second channel region CHR2, the second and third source/drain electrodes 132 and 134, the second transition metal oxide layer 110-2, and the gate electrode 120 thereon may constitute a second sub-electronic device 13b.

The first sub-electronic device 13a may be operated in substantially the same manner as that of FIGS. 5A to 5C, and the second sub-electronic device 13b may be operated in substantially the same manner as that of FIGS. 6A to 6C. In the case where voltages applied to the gate electrodes 120 have the same polarity, an on/off state of the first sub-electronic device 13a may be opposite to that of the second sub-electronic device 13b.

FIGS. 8A to 8D are graphs showing simulation results for a change in surface state of a topological insulating layer, due to the presence or absence of oxygen vacancy in a transition metal oxide layer. In the simulation, 2 QL $Bi_2Se_3$ was used as the topological insulating layer, and $TiO_2$ was used as the transition metal oxide layer.

FIG. 8A shows a simulation result obtained when there was no oxygen vacancy in the transition metal oxide layer.

FIG. 8A shows that, in the case where there was no oxygen vacancy in a transition metal oxide layer, there was a gap between a conduction band and a valence band, at a surface of a topological insulating layer. That is, in the case where there was no oxygen vacancy in the transition metal oxide layer, the surface of the topological insulating layer had high resistance.

FIG. 8B shows a simulation result obtained when a single oxygen vacancy was positioned in the transition metal oxide layer and far from the topological insulating layer.

FIG. 8B shows that, in the case where a single oxygen vacancy was positioned in the transition metal oxide layer and far from the topological insulating layer, there was a gap between the conduction and valence bands at the surface of the topological insulating layer. That is, in the case where a single oxygen vacancy was positioned in the transition metal oxide layer and far from the topological insulating layer, the surface of the topological insulating layer had high resistance.

However, in the case where the single oxygen vacancy was positioned in the transition metal oxide layer and far from the topological insulating layer, the gap between the conduction and valence bands at the surface of the topological insulating layer was small, compared to the case (e.g., of FIG. 8A) that there was no oxygen vacancy in the metal oxide layer.

Figure 8C:
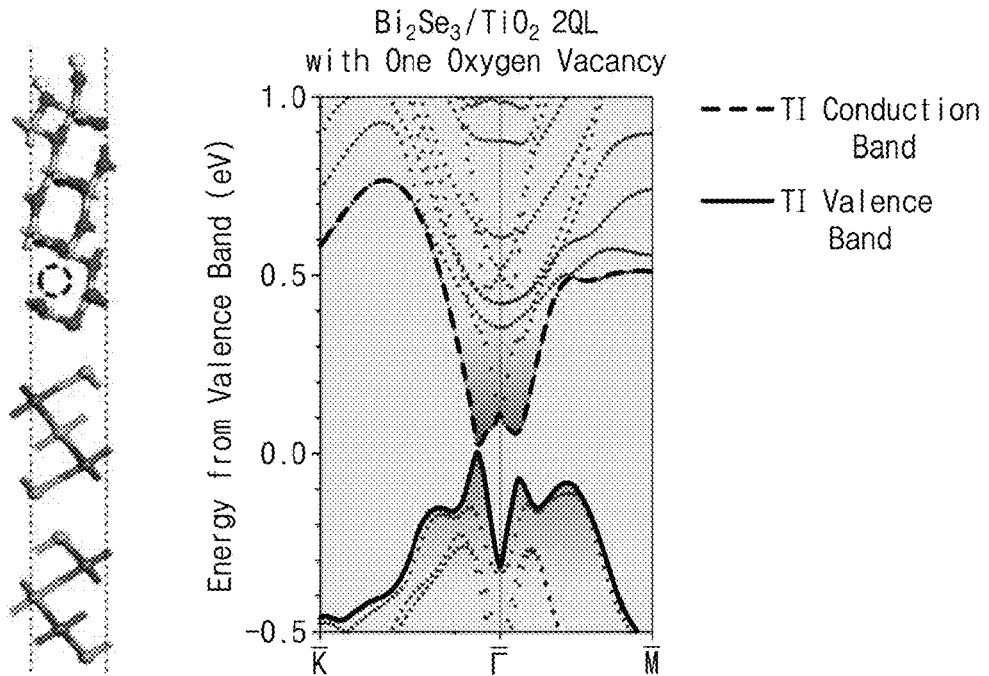
Figure 8D:
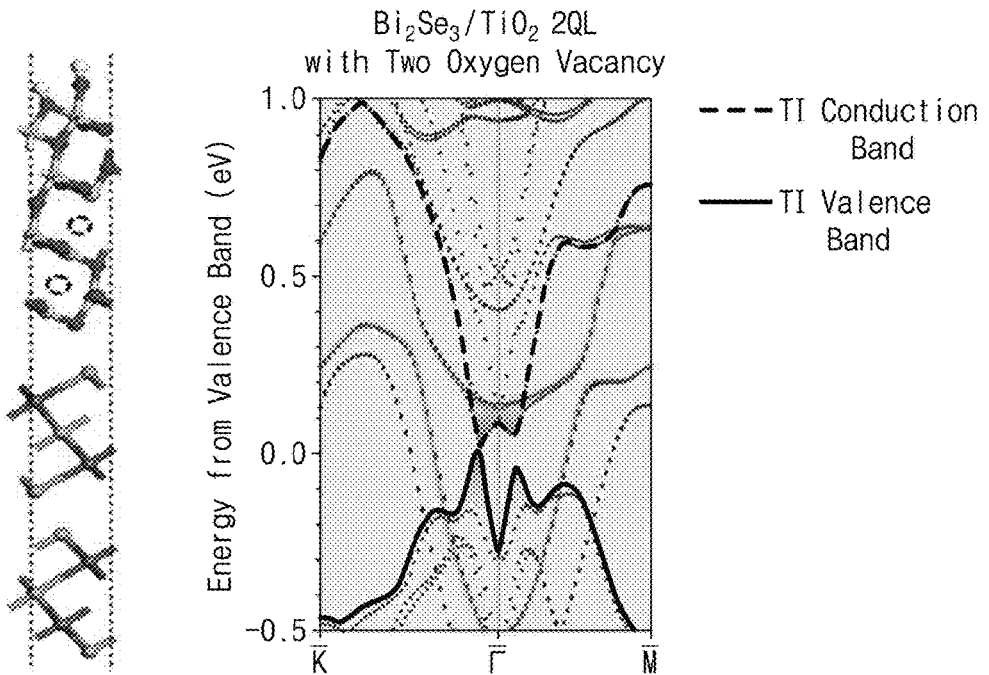

FIG. 8C shows a simulation result obtained when a single oxygen vacancy was positioned in the transition metal oxide layer and adjacent to the topological insulating layer. FIG. 8D shows a simulation result obtained when two oxygen vacancies were positioned in the transition metal oxide layer and adjacent to the topological insulating layer.

FIGS. 8C and 8D show that, in the case where at least one oxygen vacancy was positioned in the transition metal oxide layer and adjacent to the topological insulating layer, there was no gap between the conduction and valence bands at the surface of the topological insulating layer. That is, in the case where at least one oxygen vacancy was positioned in the transition metal oxide layer and adjacent to the topological insulating layer, the surface of the topological insulating layer had low resistance.

The results of FIGS. 8A to 8D show that, a resistance state of the surface of the topological insulating layer can be controlled by changing the presence or absence and positions of oxygen vacancies in the transition metal oxide layer.

Figure 9A:
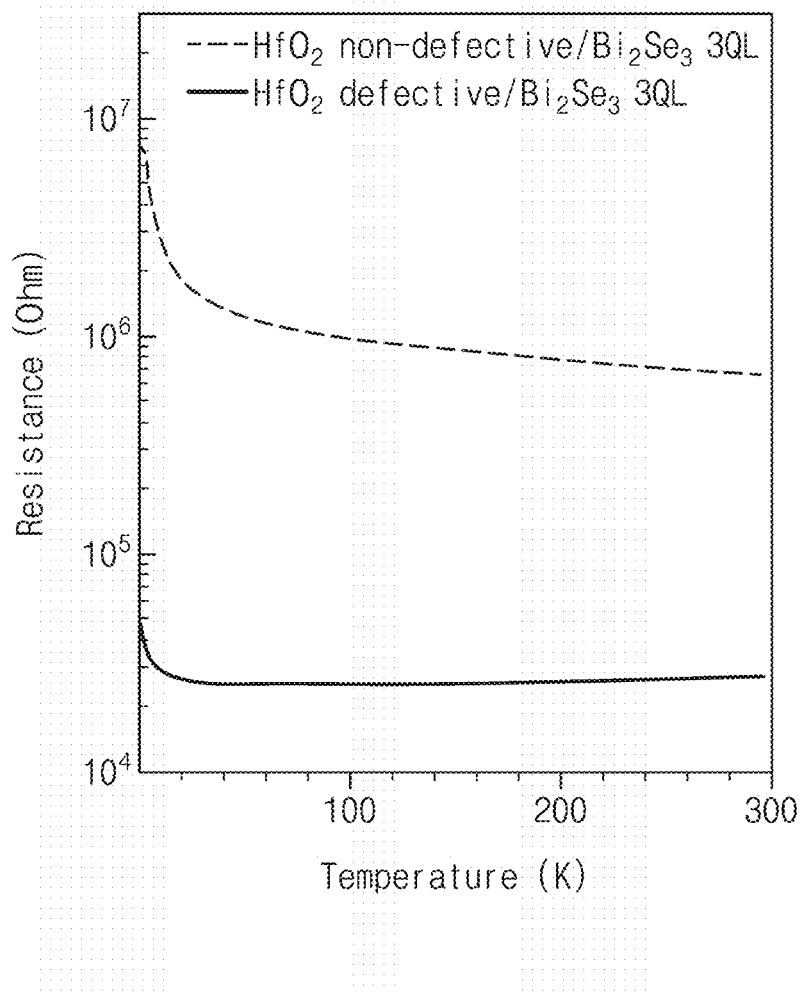
FIG. 9A is a graph showing a simulation result for a change in surface resistance of a topological insulating layer, due to the presence or absence of oxygen vacancy in a transition metal oxide layer.
Figure 9B:
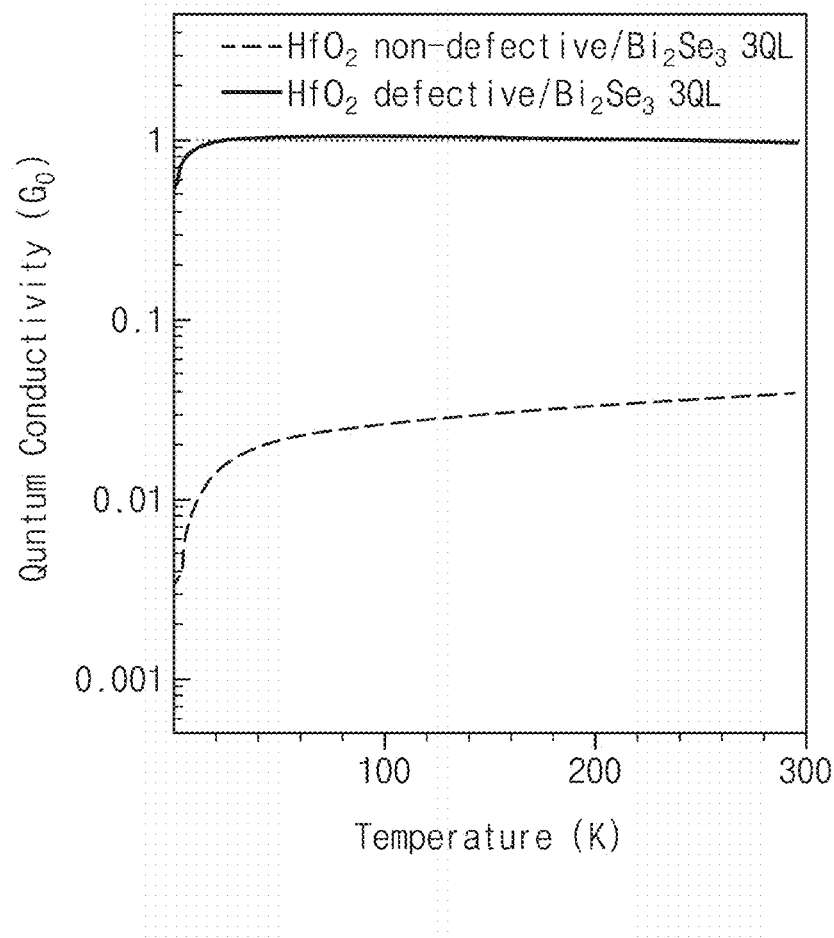
FIG. 9B is a graph showing a simulation result for a change in surface conductivity of a topological insulating layer, due to the presence or absence of oxygen vacancy in a transition metal oxide layer.

FIG. 9A is a graph showing a simulation result for a change in surface resistance of a topological insulating layer, due to the presence or absence of oxygen vacancy in a transition metal oxide layer. FIG. 9B is a graph showing a simulation result for a change in surface conductivity of a topological insulating layer, due to the presence or absence of oxygen vacancy in a transition metal oxide layer. In the simulation, 3 QL $Bi_2Se_3$ was used as the topological insulating layer, and $HfO_2$ was used as the transition metal oxide layer.

Referring to FIGS. 9A and 9B, when there are oxygen vacancies in the transition metal oxide layer, the topological insulating layer had low surface resistance or high surface conductivity. By contrast, when there is no oxygen vacancy in the transition metal oxide layer, the topological insulating layer had high surface resistance or low surface conductivity.

According to some embodiments of the inventive concept, it may be possible to control a surface resistance state of a topological insulator in an electronic device.

While example embodiments of the inventive concepts have been particularly shown and described, it will be understood by one of ordinary skill in the art that variations in form and detail may be made therein without departing from the spirit and scope of the attached claims.

What is claimed is:

1. An electronic device, comprising:
   a topological insulating layer including first and second surfaces facing each other; and
   a transition metal oxide layer provided on the first surface of the topological insulating layer,
   wherein the transition metal oxide layer comprises a first sub-oxide layer and a second sub-oxide layer, the first sub-oxide layer being positioned between the topological insulating layer and the second sub-oxide layer, and
   wherein a density of oxygen vacancies in the second sub-oxide layer is greater than a density of oxygen vacancies in the first sub-oxide layer.

2. The electronic device of claim 1, wherein the topological insulating layer has a thickness ranging from 1 nm to 10 nm.

3. The electronic device of claim 1, wherein the topological insulating layer contains a compound represented by a chemical formula $A_XB_YC_ZD_W$, where $0<X\leq10$, $0<Y\leq10$, $0<Z\leq10$, and $0<W\leq10$,
   wherein each of A and B is Bi, Sb, Ti, Pb, Sn, In, Ga, or Ge, and
   each of C and D is Se, Te, or S.

4. The electronic device of claim 1, wherein the transition metal oxide layer is in contact with the first surface.

5. The electronic device of claim 1, further comprising: a gate electrode provided on the transition metal oxide layer,
   wherein the gate electrode is configured to apply a voltage to the transition metal oxide layer.

6. The electronic device of claim 5, wherein a density of oxygen vacancies in the transition metal oxide layer is controlled by the voltage.

7. The electronic device of claim 5, wherein a charge state of oxygen vacancies in the transition metal oxide layer is controlled by the voltage.

8. The electronic device of claim 1, further comprising: first and second source/drain electrodes provided on the second surface;
   wherein the second surface comprises a portion that is located between the first and second source/drain electrodes and is used as a channel region; and
   the transition metal oxide layer is overlapped with at least a portion of the channel region, when viewed in a plan view.

9. The electronic device of claim 1, further comprising: first and second source/drain electrodes provided on the first surface,
   wherein the first and second source/drain electrodes are spaced apart from each other with the transition metal oxide layer interposed therebetween.

10. An electronic device, comprising:
    a topological insulating layer having a surface, a portion of which is used as a channel region;
    a transition metal oxide layer overlapped with the channel region, when viewed in a plan view; and
    a gate electrode provided on the transition metal oxide layer,
    wherein the gate electrode is configured to apply a voltage to the transition metal oxide layer,
    wherein the transition metal oxide layer comprises a first sub-oxide layer and a second sub-oxide layer, the first sub-oxide layer being positioned between the topological insulating layer and the second sub-oxide layer, and
    wherein a density of oxygen vacancies in the second sub-oxide layer is greater than a density of oxygen vacancies in the first sub-oxide layer.

11. The electronic device of claim 10, wherein the topological insulating layer has a thickness ranging from 1 nm to 10 nm.

12. The electronic device of claim 10, wherein resistance of the channel region is controlled by the voltage.

13. The electronic device of claim 12, wherein a density of oxygen vacancies in the transition metal oxide layer is controlled by the voltage.

14. The electronic device of claim 12, wherein a charge state of oxygen vacancies in the transition metal oxide layer is controlled by the voltage.

15. An electronic device, comprising:
    a topological insulating layer including first and second surfaces facing each other; and
    a transition metal oxide layer provided on the first surface of the topological insulating layer,
    wherein the transition metal oxide layer comprises a first sub-oxide layer and a second sub-oxide layer, the second sub-oxide layer being positioned between the topological insulating layer and the first sub-oxide layer, and
    wherein a density of oxygen vacancies in the second sub-oxide layer is greater than a density of oxygen vacancies in the first sub-oxide layer.

16. The electronic device of claim 15, wherein the transition metal oxide layer is in contact with the first surface.

17. The electronic device of claim 15, further comprising: a gate electrode provided on the transition metal oxide layer,
    wherein the gate electrode is configured to apply a voltage to the transition metal oxide layer.

* * * * *